United States Patent
Yang et al.

(10) Patent No.: US 10,739,422 B2
(45) Date of Patent: Aug. 11, 2020

(54) FLEXIBLE COAXIAL MAGNETIC RESONANCE IMAGING (MRI) COIL WITH INTEGRATED DECOUPLING

(71) Applicant: Quality ELectrodynamics, LLC, Mayfield Village, OH (US)

(72) Inventors: Xiaoyu Yang, Indiana, PA (US); Tsinghua Zheng, Chesterland, OH (US); Yong Wu, Shaker Heights, OH (US); Matthew Finnerty, University Heights, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 585 days.

(21) Appl. No.: 15/596,118

(22) Filed: May 16, 2017

(65) Prior Publication Data

US 2018/0335491 A1 Nov. 22, 2018

(51) Int. Cl.
*G01R 33/34* (2006.01)
*G01R 33/341* (2006.01)
*G01R 33/36* (2006.01)

(52) U.S. Cl.
CPC ..... *G01R 33/34007* (2013.01); *G01R 33/341* (2013.01); *G01R 33/3657* (2013.01)

(58) Field of Classification Search
CPC .......... G01R 33/34007; G01R 33/3657; G01R 33/341
See application file for complete search history.

(56) References Cited

U.S. PATENT DOCUMENTS

| | | | |
|---|---|---|---|
| 4,083,006 A | 4/1978 | Yokoshima | |
| 4,605,899 A | 8/1986 | Eumurian et al. | |
| 4,775,837 A | 10/1988 | Roeschmann et al. | |
| 4,816,766 A | 3/1989 | Zabel et al. | |
| 5,565,778 A | 10/1996 | Brey et al. | |

(Continued)

FOREIGN PATENT DOCUMENTS

WO 2013013680 A1 1/2013

OTHER PUBLICATIONS

Non-Final Office Action dated Nov. 3, 2016 for U.S. Appl. No. 14/270,399.

(Continued)

*Primary Examiner* — Akm Zakaria
(74) *Attorney, Agent, or Firm* — Eschweiler & Potashnik, LLC

(57) ABSTRACT

Example magnetic resonance imaging (MRI) radio frequency (RF) coils employ flexible coaxial cable. An MRI RF coil may include an LC circuit and an integrated decoupling circuit. The LC circuit includes one or more flexible coaxial cables having a first end and a second end, the one or more flexible coaxial cables having an inner conductor, an outer conductor, and a dielectric spacer disposed between the inner conductor and the outer conductor, where the outer conductor of the coaxial cable is not continuous between the first end and the second end at a first location. The integrated decoupling circuit may include a PIN diode and a tunable element. The tunable element may be tunable with respect to resistance, capacitance, or inductance, and thus may control, at least in part, the frequency at which the LC circuit resonates during RF transmission, or an impedance at the first location.

30 Claims, 12 Drawing Sheets

(56) References Cited

U.S. PATENT DOCUMENTS

| | | | |
|---|---|---|---|
| 6,184,684 B1* | 2/2001 | Dumoulin | G01R 33/3628 |
| | | | 324/318 |
| 6,414,488 B1* | 7/2002 | Chmielewski | G01R 33/3657 |
| | | | 324/311 |
| 6,636,040 B1 | 10/2003 | Eydelman | |
| 6,847,210 B1 | 1/2005 | Eydelman et al. | |
| 7,573,432 B1 | 8/2009 | Eydelman et al. | |
| 7,778,682 B2 | 8/2010 | Kumar | |
| 7,800,368 B2 | 9/2010 | Vaughan | |
| 8,013,609 B2 | 9/2011 | Vartiovaara | |
| 8,040,586 B2 | 10/2011 | Smith | |
| 8,269,499 B2 | 9/2012 | Hamamura | |
| 8,754,647 B2 | 6/2014 | Van Helvoort | |
| 8,830,556 B2 | 9/2014 | Smith | |
| 2003/0028094 A1* | 2/2003 | Kumar | A61B 5/055 |
| | | | 600/410 |
| 2013/0069652 A1 | 3/2013 | Otake et al. | |
| 2014/0024909 A1* | 1/2014 | Vij | A61B 5/055 |
| | | | 600/373 |
| 2016/0033594 A1 | 2/2016 | Yang et al. | |

OTHER PUBLICATIONS

Notice of Allowance dated Feb. 15, 2017 for U.S. Appl. No. 14/270,399.

Cassidy et al., Determining the Tuning and Matching Requirements of RF Coils Using Electromagnetic Simulation and Electric Circuit Analysis, 2005, Concepts in Magnetic Resonance Part 8 (Magnetic Resonance Engineering), vol. 258 (1), pp. 27-41.

U.S. Appl. No. 14/450,312, filed Aug. 4, 2014.

Non-Final Office Action dated Jun. 26, 2017 in connection with U.S. Appl. No. 14/150,312.

Notice of Allowance dated Nov. 29, 2017 in connection with U.S. Appl. No. 14/450,312.

* cited by examiner

FLEXIBLE COAXIAL MAGNETIC RESONANCE IMAGING (MRI) COIL WITH INTEGRATED DECOUPLING

BACKGROUND

Magnetic resonance imaging (MRI) involves the transmission and receipt of radio frequency (RF) energy. RF energy may be transmitted by a coil. Resulting magnetic resonance (MR) signals may also be received by a coil. Conventionally, RF energy has been transmitted from a single coil and resulting MR signals received by a single coil. Multiple receivers may be used in parallel acquisition techniques. Similarly, multiple transmitters have been used in parallel transmission techniques.

RF coils create the B1 field that rotates the net magnetization in a pulse sequence. RF coils may also detect precessing transverse magnetization. Thus, RF coils may be transmit (Tx) coils, receive (Rx) coils, or transmit and receive (Tx/Rx) coils. Typically, the transmitted RF signals are orders of magnitude larger than the MR signals generated by the excited nuclei and detected by the RF Rx coils. To protect the Rx coils and receiver circuits and apparatus, the Rx coils may be decoupled or detuned while RF is being transmitted by an MR apparatus. The decoupling or detuning may be active or passive. Active decoupling involves, for example, applying a bias to a PIN diode semiconductor switch in conjunction with an LC circuit during RF transmission. Passive decoupling involves, for example, using antiparallel diode semiconductor switches in conjunction with LC circuitry. The antiparallel diode semiconductor switches are switched upon detecting high power RF transmit pulses, which allows high currents, but not low currents, to interact with the parallel resonant LC circuit that decouples the coil.

An imaging coil needs to be able to resonate at a selected Larmor frequency. Imaging coils include inductive elements and capacitive elements. The resonant frequency, $v$, of an RF coil is determined by the inductance (L) and capacitance (C) of the inductor capacitor circuit according to:

$$v = \frac{1}{2\Pi\sqrt{LC}}$$

Imaging coils may need to be tuned. Tuning an imaging coil may include varying the performance of a capacitor. Recall that frequency: $f=\omega/(2\pi)$, wavelength: $\lambda=c/f$, and $\lambda=4.7$ m at 1.5 T. Recall also that the Larmor frequency: $f_0=\gamma B_0/(2\pi)$, where $\gamma/(2\pi)=42.58$ MHz/T; at 1.5 T, $f_0=63.87$ MHz; at 3 T, $f_0=127.73$ MHz; at 7 T, $f_0=298.06$ MHz. Basic circuit design principles include the fact that capacitors add in parallel (impedance $1/(jC\omega)$) and inductors add in series (impedance $jL\omega$).

When MRI coils that are tuned to the same radio frequency are positioned close together, which may occur, for example, in phased array coils, the MRI coils may inductively couple to each other, which causes the MRI coils to detune each other. Detuning due to inductive coupling reduces image quality as compared to using single coils individually. Conventional phased array coils may address the detuning due to inductive coupling problem by overlapping coils or by using preamplifiers that dampen current flow in individual coils.

Referring to Prior Art FIG. 1, a single RF coil segment 102 is illustrated schematically to include an inductance 103, a resistance 104, and a capacitance 105. Capacitance 105 is selected to tune the segment 102 to a desired frequency (e.g., Larmor frequency). The RF coil segment 102 is connected across the output of a current control circuit 106 that is driven by an input signal 107 to produce a current in the RF coil segment 102. Unfortunately, an additional induced current may also flow through the RF coil segment 102 due to signals indicated at 108 induced by currents flowing in other (e.g., adjacent) RF coil segments. With multiple driving loops tuned at a single image frequency, which may occur in a phased array coil, the current on a loop is a superposition of the driven current and currents induced by other transmitters due to electromagnetic induction.

Conventionally, attempts to reduce, minimize, or eliminate the coupling through the mutual impedance in two interacting elements may have been attempted by cancelling the mutual impedance or by reducing the current in the coil. Mutual inductance may be cancelled by either partial overlap of adjacent coils, which may be referred to as transformer type decoupling, or by using decoupling capacitors. Other conventional approaches include using a preamplifier decoupling network to isolate coil elements by creating a large impedance block at the terminals of a receive element, which suppresses currents driven by the spin induced electromotive force (emf).

There are many design issues associated with MRI RF coil design. For example, the inductance of a conventional coil depends on the geometry of the coil. For a square coil with a side length a and wire diameter f: $L=[\mu_0/\pi][-4a+2a\sqrt{2}-2a\log(1+\sqrt{2})+2a\log(4a/f)]$. For a loop coil with loop diameter d and wire diameter f: $L=[\mu_0 d/2][\log(8d/f)-2]$. Thus, the selection of the geometry of a coil determines, at least in part, the inductance of the coil.

The resistance of a coil also depends on the geometry of the coil. The resistance R of a conductor of length l and cross-sectional area A is $R=\rho l/A$, where $\rho$ is the conductor resistivity and is a property of the conductor material and the temperature. For a copper wire coil with loop diameter d and wire diameter f: $R=d\rho_{Cu}/(f\delta_{Cu})$. For a copper foil coil with loop diameter d, copper thickness t, and copper width w: $R=\pi d\rho_{Cu}/(2w\delta_{Cu})$, where t is much greater than the copper skin depth and w is much greater than t. Thus, the selection of the geometry of a coil and the material (e.g., wire, foil) determines, at least in part, the inductance of the coil. The length of the loop also impacts the properties of the coil.

Coils may be characterized by their signal voltage, which is the electromotive force (emf) induced in a coil: $\xi=-\partial\varphi/\partial t \propto -\partial(B_1 \cdot M_0)/\partial t$, where $\varphi$ is the magnetic flux across the coil (closed loop), magnetization $M_0=N\gamma^2(h/(2\pi))^2 s(s+1)B_0/(3k_B T_S)=\sigma_0 B_0/\mu_0$, where N is the number of nuclear spins s per unit volume (s=½ for protons) and $T_S$ is the temperature of the sample. Since $\omega_0=\gamma B_0$, $\xi \propto \omega_0^2$. The noise in a coil may be thermal (e.g., $v=(4k_B T_S R\Delta f)^{1/2}$, where R is the total resistance and $\Delta f$ is the bandwidth of the received signal). The signal to noise ratio (SNR) for a coil may be described by $\xi/v$.

Coils may be used for transmitting RF energy that is intended to cause nuclear magnetic resonance (NMR) in a sample. The frequency at which NMR will be created depends on the magnetic field present in the sample. Both the main magnetic field B0 produced by the MRI apparatus and the additional magnetic field B1 produced by a coil contribute to the magnetic field present in the sample. For a circular loop coil, the transmit B1 field equals the coil sensitivity. A circular loop of radius a carrying a current I produces on axis the field: $B=\mu_0 I a^2/[2(a^2+z^2)^{3/2}]$.

RF coils for MRI may need to be tuned and matched. Tuning involves establishing or manipulating the capacitance in a coil so that a desired resistance is produced. Matching involves establishing or manipulating the capacitance in a coil so that a desired reactance is achieved. When tuning, the impedance z may be described by $Z=R+jX=1/(1/(r+jL\omega)+jC\omega)$. Tuning may be performed to achieve a desired tuning frequency for a coil. $\omega_0$ identifies the desired tuning frequency. $\omega_0$, may be, for example, 63.87 MHz at 1.5 T. The size of a conventional coil facilitates estimating inductance L. With an estimate of L in hand, values for capacitors can be computed to produce a desired resonant peak in an appropriate location with respect to $\omega_0$. Once capacitors are selected, the resonant peak can be observed and a more accurate L can be computed. The capacitors can then be adjusted to produce the desired resistance. Once the desired resistance is achieved, then capacitance can be adjusted to cancel reactance.

MRI RF coils may use PIN diodes. When forward-biased, a PIN diode may produce a negligible resistance (e.g., 0.1Ω), which is essentially a short-circuit. When reverse-biased, a PIN diode may produce a high resistance (e.g., 200 kΩ) in parallel with a low capacitance (e.g., −2Ω), which is essentially an open-circuit.

Thus, conventional coil design may be a complicated process that requires numerous decisions. Additionally, conventional coil fabrication may be a complicated process that requires accurately implementing manufactures that reflect the design decisions.

Prior Art FIG. 2 illustrates a schematic of a simple conventional RF coil 200 for MRI. The coil 200 is illustrated as a loop 210. Loop 210 has elements that produce a resistance (R) (e.g., resistor 220) and that produce an inductance (L) (e.g., inductor 230). A conventional loop may include a matching capacitor 240 and tuning capacitor 250 that produce capacitance (C). The simple RF coil 200 may be referred to as an LC coil or as an RLC coil. Conventionally, the resistor 220, inductor 230, and capacitor 250 may all have been two terminal passive elements that were soldered to copper wire or copper foil that was attached to a printed circuit board.

A resistor may be, for example, a passive, two-terminal electrical component that implements electrical resistance as a circuit element. Resistors reduce current flow. Resistors also lower voltage levels within circuits. Resistors may have fixed resistances or variable resistances. The current that flows through a resistor is directly proportional to the voltage applied across the resistor's terminals. This relationship is represented by Ohm's Law: V=IR, where I is the current through the conductor, V is the potential difference across the conductor, and R is the resistance of the conductor.

An inductor, which may also be referred to as a coil or reactor, may be a passive two-terminal electrical component that resists changes in electric current. An inductor may be made from, for example, a wire that is wound into a coil. When a current flows through the inductor, energy may be stored temporarily in a magnetic field in the coil. When the current flowing through the inductor changes, the time-varying magnetic field induces a voltage in the inductor. The voltage will be induced according to Faraday's law and thus may oppose the change in current that created the voltage.

A capacitor may be a passive, two-terminal electrical component that is used to store energy. The energy may be stored electrostatically in an electric field. Although there are many types of practical capacitors, capacitors tend to contain at least two electrical conductors that are separated by a dielectric. The conductors may be, for example, plates and the dielectric may be, for example, an insulator. The conductors may be, for example, thin films of metal, aluminum foil or other materials. The non-conducting dielectric increases the capacitor's charge capacity. The dielectric may be, for example, glass, ceramic, plastic film, air, paper, mica, or other materials. Unlike a resistor, a capacitor does not dissipate energy. Instead, a capacitor stores energy in the form of an electrostatic field between its conductors.

When there is a potential difference across the conductors, an electric field may develop across the dielectric. The electric field may cause positive charge (+Q) to collect on one conductor and negative charge (−Q) to collect on the other conductor.

Prior Art FIG. 3 illustrates a schematic of another simple RF coil 300 for MRI. RF coil 300 may also be referred to as an LC coil or as an RLC coil. The coil 300 is illustrated as a square loop 310. Loop 310 has elements that produce a resistance (e.g., resistor 320) and that produce an inductance (e.g., inductor 330). A conventional loop may include a capacitor 340 and capacitor 350 that work together to achieve matching. Once again, the resistor 320, inductor 330, and capacitors 340 and 350 may have been soldered to copper wire or copper foil that was attached to a printed circuit board. Coil 300 is contrasted with coil 200 (Prior Art FIG. 2) that included capacitor 250 for tuning purposes.

Prior Art FIG. 4 illustrates a conventional RLC coil 400 that performs traditional "distributed" decoupling using components L41 and D41. Coil 400 includes capacitors C41, C42, C43, and inductors L41, L42, and L43. Coil 400 includes a pre-amplifier circuit 410. Coil 400 also includes a PIN diode D41. Recall that a PIN diode has a wide, lightly doped near intrinsic semiconductor region positioned between a p-type semiconductor region and an n-type semiconductor region that are used for ohmic contacts. The wide intrinsic region makes the PIN diode suitable for fast switches. Fast switching may be employed in MRI coils. In transmit mode, the PIN diode D41 may be turned off.

In conventional coil 400, a single capacitor C42 is illustrated to represent one or more capacitors that may be employed in the coil 400. Thus, capacitor C42 may be an equivalent capacitor of multiple breaking point capacitors that may appear in coil 400. Inductor L42 represents the inductance of the coil. The inductance may be produced, for example, by a copper trace that forms the coil 400.

In the conventional coil 400, capacitor C41 is the breaking point capacitor that is used for decoupling the coil 400 from other MRI coils. Capacitor C41 and inductor L41 are in parallel resonance and the impedance across capacitor C41 is high. Capacitor C41 is a single high impedance point in coil 400. Since the impedance across capacitor C41 is high, an induced voltage on coil 400 cannot generate a large current through capacitor C42. In a conventional coil like coil 400, the single high impedance point (e.g., capacitor C41) may get unacceptably or dangerously hot producing heat dissipation issues that in turn limit the operation of coil 400.

BRIEF DESCRIPTION OF THE DRAWINGS

The accompanying drawings, which are incorporated in and constitute a part of the specification, illustrate various example systems, methods, and other embodiments of various aspects of the invention. It will be appreciated that the illustrated element boundaries (e.g., boxes, groups of boxes, or other shapes) in the figures represent one example of the boundaries. One of ordinary skill in the art will appreciate that in some embodiments one element may be designed as multiple elements, multiple elements may be designed as one element, an element shown as an internal component of another element may be implemented as an external component and vice versa, and so on. Furthermore, elements may not be drawn to scale.

Prior Art

Prior Art

Prior Art

Prior Art

DETAILED DESCRIPTION

Figure 5:
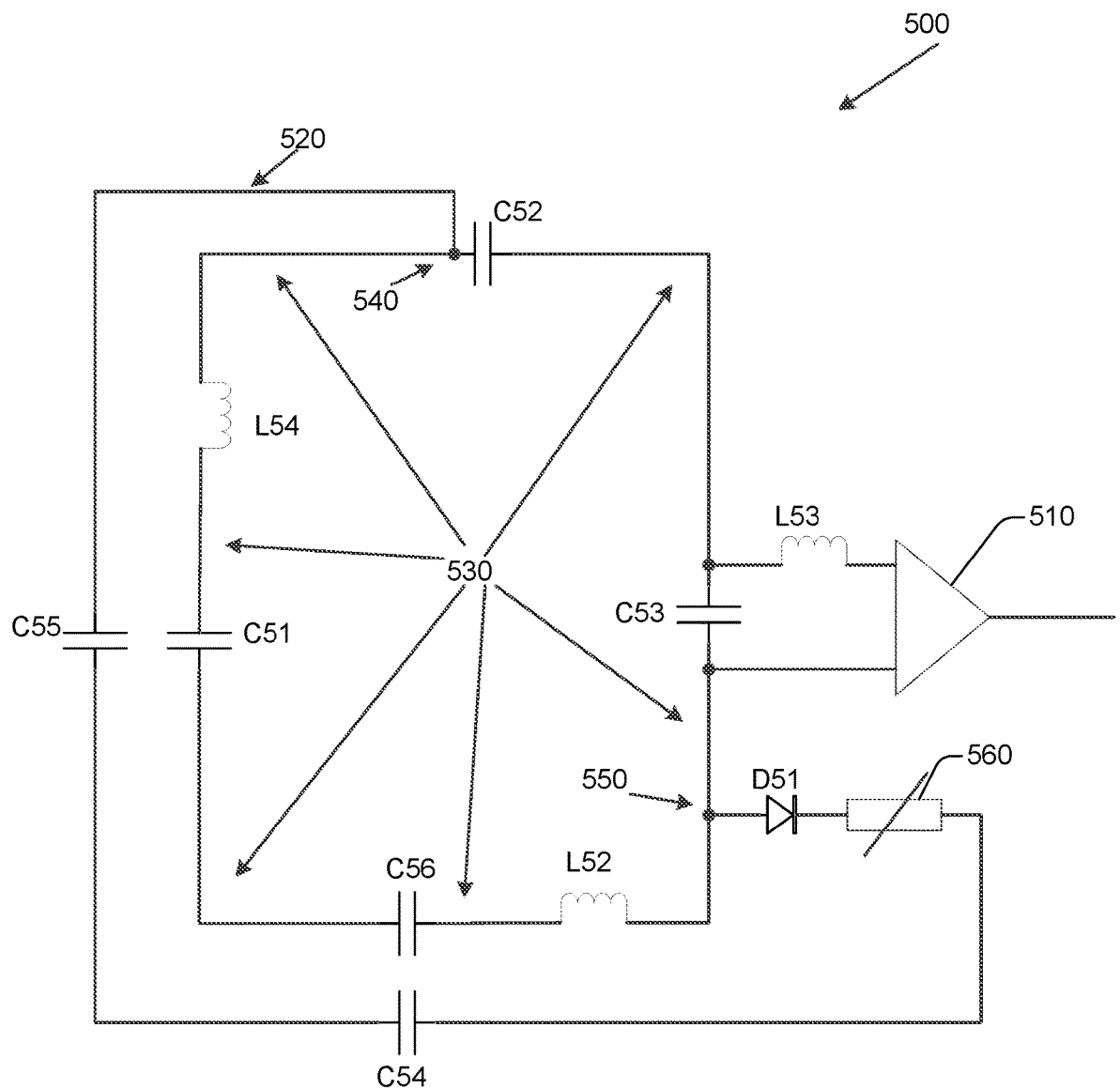
FIG. 5 illustrates an example MRI coil that performs integrated decoupling.

FIG. 5 illustrates an example MRI coil 500 that performs integrated decoupling using a circuit that includes a PIN diode D51 and a tunable element 560. MRI coil 500 includes capacitors C51, C52, C53, C54, C55, and C56. MRI coil 500 also includes inductors L52, L53, and L54. A greater or lesser number of capacitors and inductors arranged in different configurations may be employed. MRI coil 500 also includes PIN diode D51 and tunable device 560. MRI coil 500 includes a wire or other conductor 520 that is attached to coil 500 at locations 540 and 550. MRI coil 500 also includes a pre-amplifier 510. The portion of coil 500 that includes C52, L54, C51, C56, L52, C53, L53, and pre-amplifier 510 represents an RLC circuit. The portion of coil 500 that includes conductor 520, C55, C54, D51, and tunable element 560 represents the integrated decoupling circuit. Conductor 520, which may be a conductor other than a wire, is placed at a determined position with respect to a conductor 530 connecting the elements of the RLC circuit.

Capacitors C52, C51, and C56 are breaking point capacitors for coil 500. A wire or other conductor 520 is positioned within a threshold distance of coil 500. The conductor 520 is connected from one location (e.g., 540) on the conductor 530 to another location (e.g., 550) on the conductor 530. The conductor 520 may be broken with one or more capacitors (e.g., C55 and C54) and connected back to the coil 500 using, for example, PIN diode D51 and a tunable device (e.g., 560) whose reactance can be adjusted. In one embodiment, the conductor 520 may be placed within one millimeter of the conductor 530. In another embodiment, the conductor 520 may be placed within one centimeter of the conductor 530. In another embodiment, the conductor 520 may be placed between one millimeter and two millimeters of the conductor 530. In another embodiment, the conductor 520 may be placed between one centimeter and two centimeters of the conductor 530.

When the coil 500 is being operated in transmit (Tx) mode, PIN diode D51 is on (e.g., shorted) and the tunable device 560 is configured so that inductor L54, capacitor C55, capacitor C54, inductor L52, capacitor C56, capacitor C51 and inductance from conductor 520 and conductor 530 produce resonance at the transmit frequency. When inductor L54, capacitor C55, capacitor C54, inductor L52, capacitor C56, capacitor C51 and inductance from conductor 520 and conductor 530 produce resonance at the transmit frequency, high impedance may be experienced across the capacitors C51 and C56 and inductors L52, and L54. Recall that in conventional coil 400 there may have been a single point of high impedance which may have produced heat issues and operational limitations. Having multiple points of high impedance and having the conductor 520 provide a larger heat sink than a conventional coil reduces heat issues, and increases the usefulness of the coil in a clinical setting. The coil 500 is designed so that the reactance from point 540 to point 550 in coil 500 while the coil 500 is operating at the transmission frequency is large enough to avoid self-canceling between the capacitors C51 and C56 and inductors L52, and L54.

Compared to prior art coil 400, example coil 500 has multiple points of high impedance that are produced with one diode instead of a single point of high impedance. The conductor 520 and additional points of high impedance facilitate reducing the heat at any single capacitor so that high, unacceptable, or dangerous heat levels are not produced as may be the case in conventional coil 400. Additionally, in coil 500, the diode position can be chosen with more freedom. The path of conductor 520, which travels through C55, C54, 560, and D51 is positioned within a threshold distance of the path from 540 to 550. In one embodiment, the path of conductor 520 is within one millimeter of the path from 540 to 550. Positioning the path of conductor 520 within the threshold distance allows the decoupling current to be self-cancelled, which in turn avoids heating issues or distortions in an imaging area disposed a distance away. Positioning the path of conductor 520 within the threshold distance also reduces or even minimizes coupling between the transmit field and the area enclosed by the paths.

Figure 6:
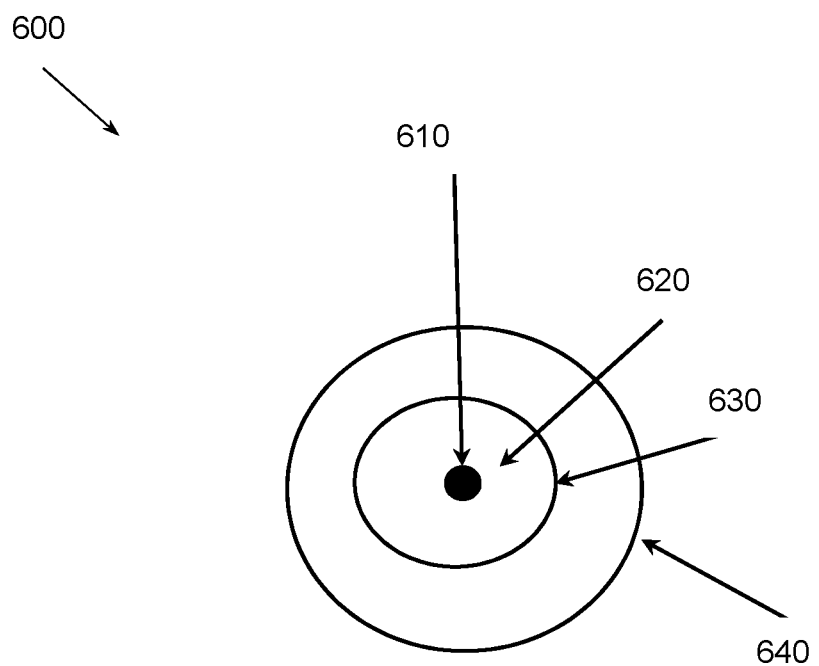
FIG. 6 illustrates an example coaxial cable.

Embodiments described herein that perform integrated decoupling using a circuit that includes a PIN diode and a tunable element may employ coaxial cable as a conductor. Prior Art FIG. 6 illustrates a cross-section of a conventional coaxial ("coax") cable 600. Cable 600 includes an inner conductor 610 which may be, for example, a copper wire. Cable 600 also includes an outer conductor 630 which may be, for example, a copper mesh. A dielectric spacer 620 may reside between the inner conductor 610 and the outer conductor 630. The cable 600 may be protected by an outer cover 640.

Figure 1:
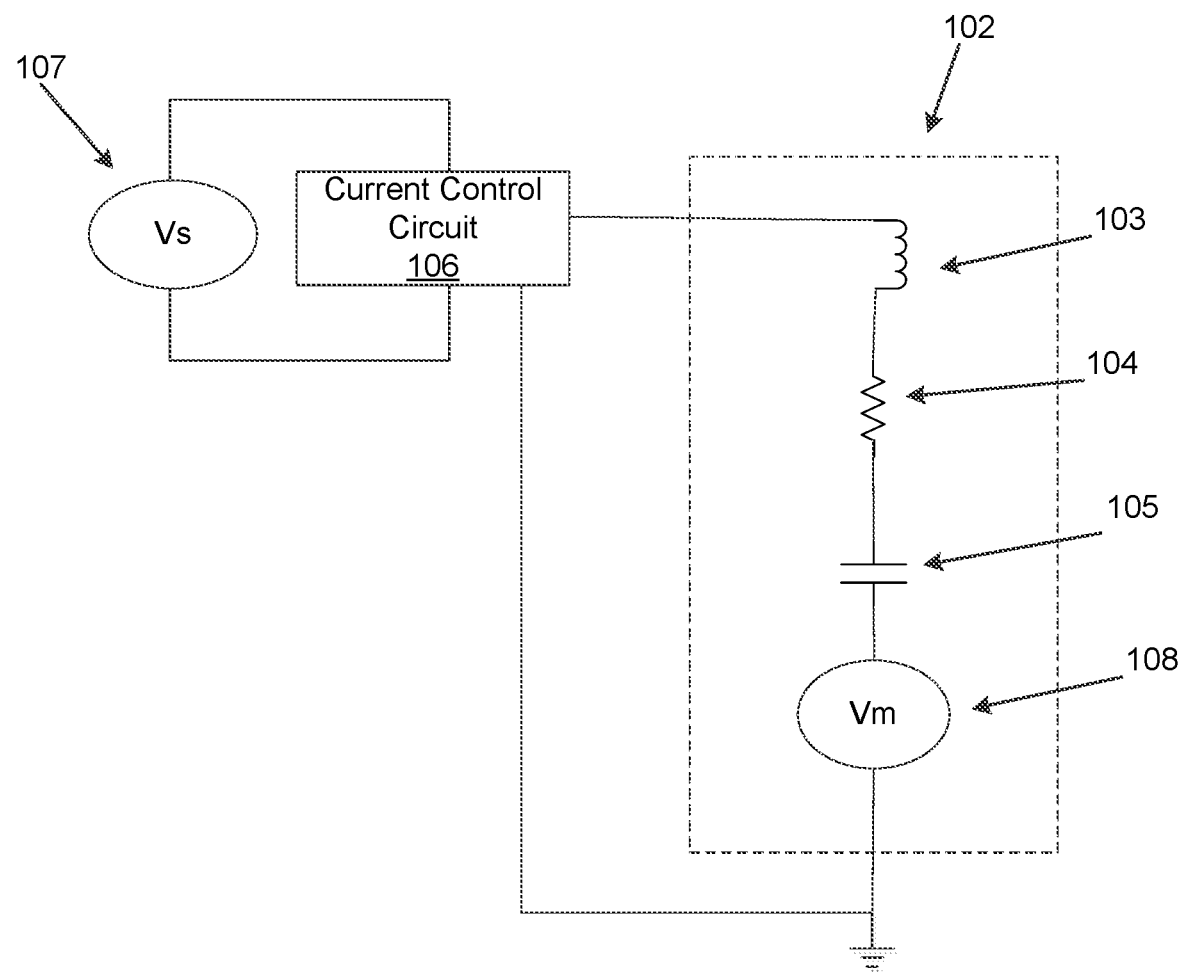
FIG. 1 illustrates a conventional RF coil for MRI that may experience inductive coupling.
Figure 2:
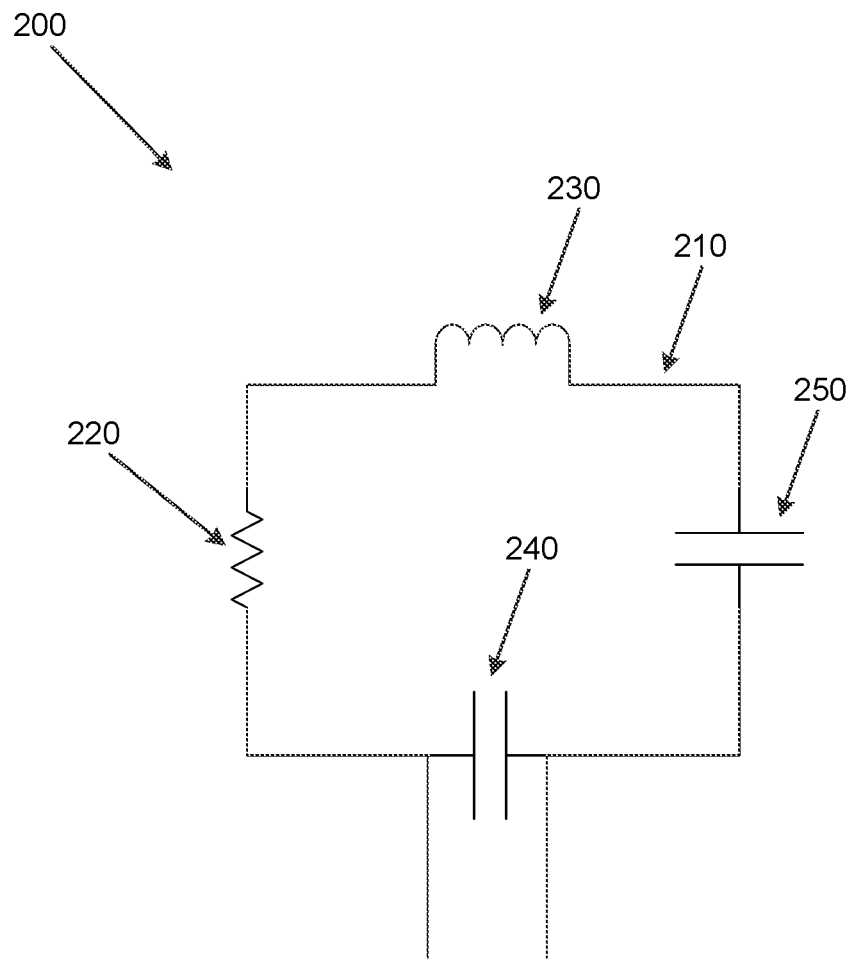
FIG. 2 illustrates portions of a radio frequency (RF) coil for magnetic resonance imaging (MRI).
Figure 3:
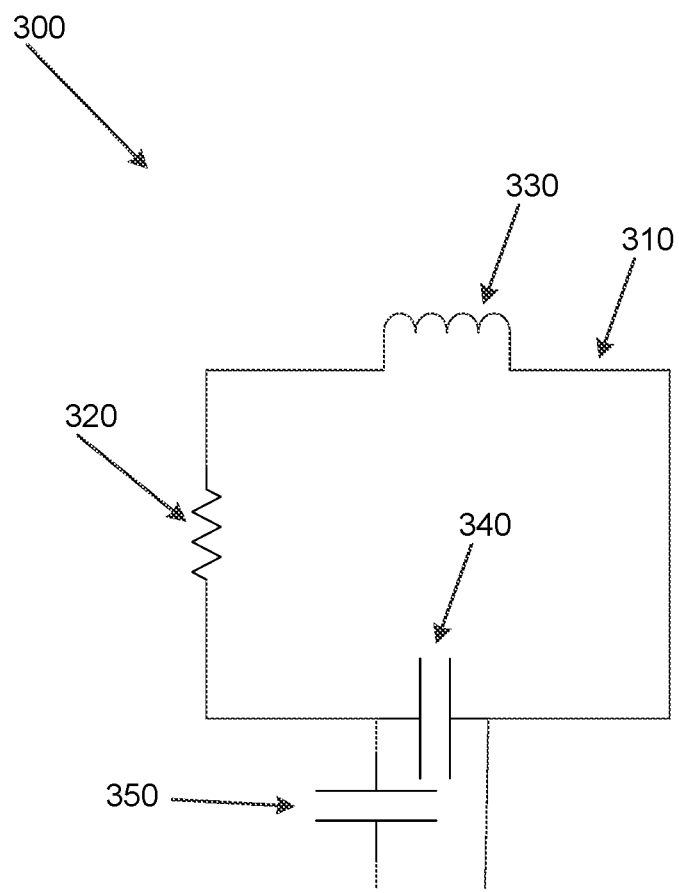
FIG. 3 illustrates portions of an RF coil for MRI.
Figure 4:
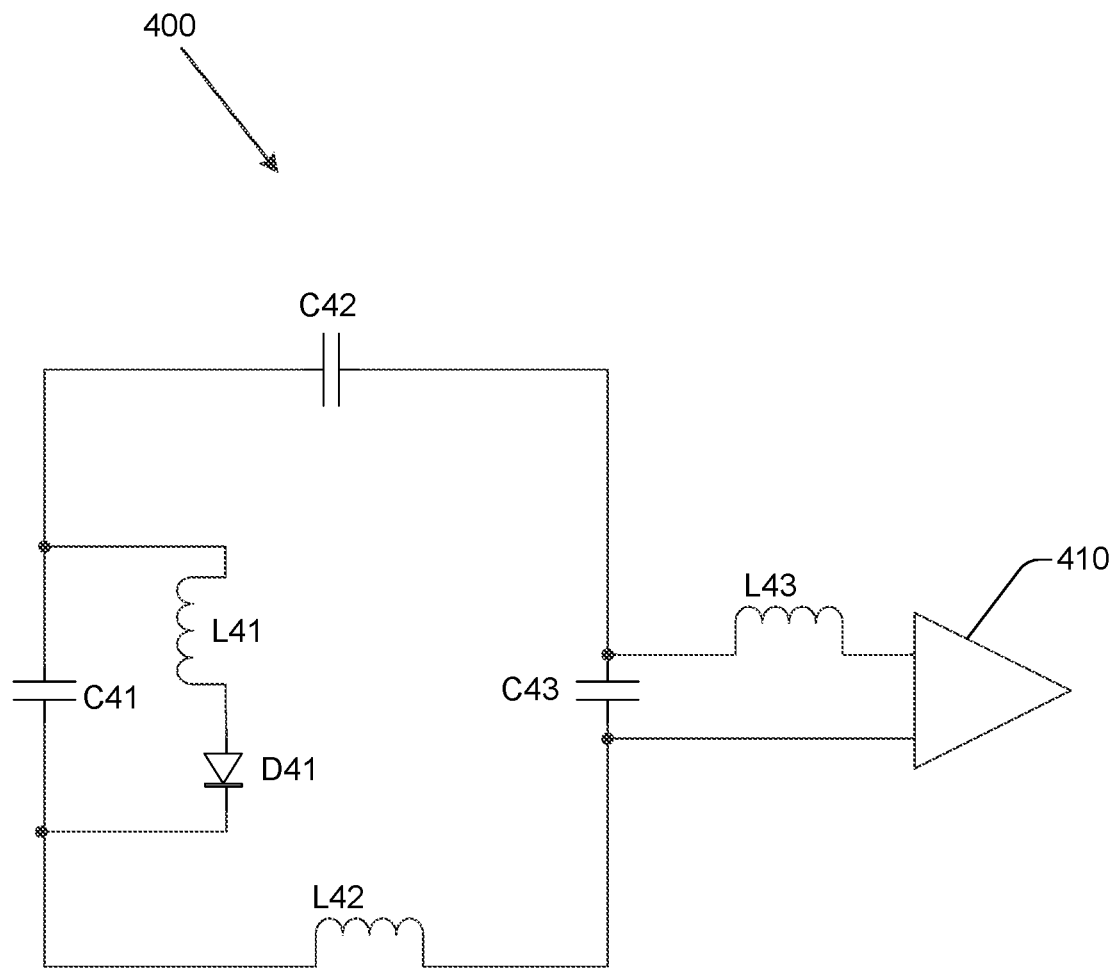
FIG. 4 illustrates an RF coil for MRI that performs conventional decoupling.

The inner conductor, dielectric spacer, and outer conductor of a coaxial cable have properties that facilitate producing the capacitance necessary for producing an MRI coil. As illustrated in Prior Art FIG. 2, a simple RF coil 200 may be a loop 210 with elements that produce a resistance (e.g., resistor 220) and that produce an inductance (e.g., inductor 230). A conventional loop may include a matching capacitor 240. Conventionally, the resistor 220, inductor 230, and capacitor 240 may all have been two terminal passive elements that are soldered to copper wire or copper foil that was attached to a printed circuit board. Embodiments described herein may not rely exclusively on soldered on components like resistor 220, inductor 230, or capacitor 240 to produce an MRI coil. Instead, example apparatus may manipulate the inner conductor, dielectric spacer, or outer conductor of a coaxial cable to manipulate capacitance for an MRI coil. A conventional MRI coil may have conventional copper wire or copper foil printed on a conventional circuit board with discrete components (e.g., resistors, inductors, capacitors) soldered to the circuit board. Example embodiments may have a coaxial cable that has been manipulated (e.g., selectively cut) to produce the desired properties. Thus, some embodiments of MRI coils and other apparatus described herein, including MRI coils 900, 1000, apparatus 1100, or MRI RF coil 1200, may include all, some, or none of capacitors C51, C52, C53, C54, C55, and C56.

Figure 7:
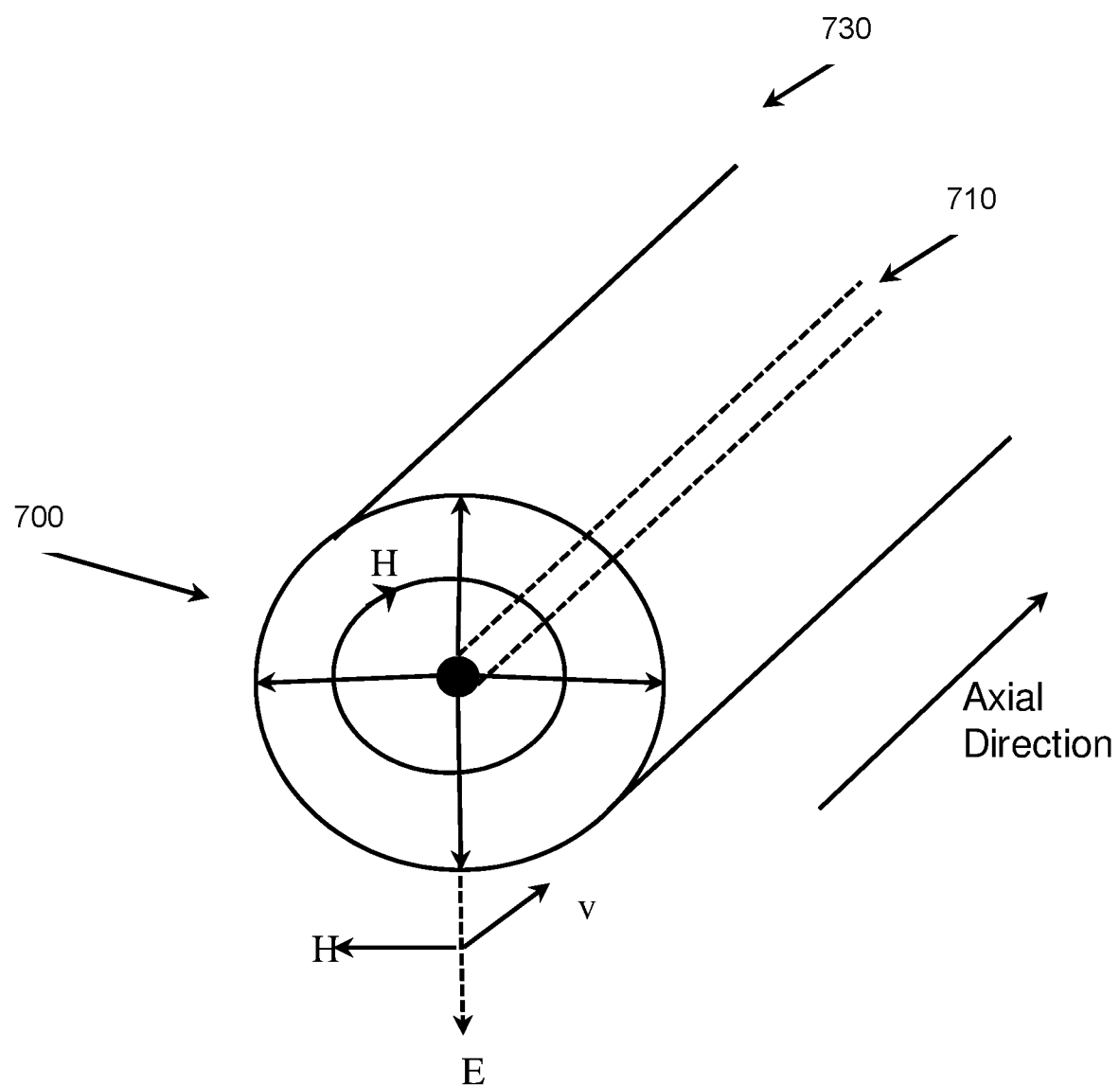
FIG. 7 illustrates an example coaxial cable.

Prior Art FIG. 7 illustrates a portion of a coaxial cable 700 suitable for use by embodiments described herein. Cable 700 includes an inner conductor 710 and an outer conductor 730. The dielectric is not illustrated, for clarity. In coaxial cable 700, energy propagates in an axial direction in the region between the two conductors. In FIG. 7, E represents an electric field, H represents a magnetic field, and V represents a velocity showing axial direction of propagation. For a cylindrical geometry like coaxial cable 700, the capacitance may be stated as a capacitance per unit length. The charge resides on the outer surface of the inner conductor 710 and the inner wall of the outer conductor 730. The capacitance expression is:

$$\frac{C}{L} = \frac{2\pi\kappa\varepsilon_0}{\ln\left[\frac{b}{a}\right]}$$

where a represents the diameter of the inner conductor 710 and b represents the distance from the center of the inner conductor 710 to the inner edge of the outer conductor 730. Since the charge resides on the outer surface of the inner conductor 710 and the inner wall of the outer conductor 730, changes to the outer surface of the inner conductor 710 or changes to the inner surface of the outer conductor 730 may change the capacitance of the coaxial cable 700.

The capacitance for cylindrical or spherical conductors can be obtained by evaluating the voltage difference between the conductors. Gauss' law applied to an infinite cylinder in a vacuum reveals that the electric field outside a charged cylinder is:

$$E = \frac{\lambda}{2\Pi\varepsilon_0 r}.$$

The voltage between the cylinders is determined by integrating the electric field along a radial line according to:

$$\Delta V = \frac{\lambda}{2\Pi\varepsilon_0}\int_a^b \frac{1}{r}dr = \frac{\lambda}{2\Pi\varepsilon_0}\ln\left[\frac{b}{a}\right].$$

The capacitance per unit length is defined as:

$$\frac{C}{L} = \frac{\lambda}{\Delta V} = \frac{2\pi k e_0}{\ln\left[\frac{b}{a}\right]}$$

when the volume between the inner conductor 710 and the outer conductor 730 is filled by a dielectric of dielectric constant k, as is the case for cable 700.

A coaxial cable has an intrinsic impedance that is proportional to $$\sqrt{\frac{L}{C}},$$

where L is the unit inductance of the coaxial cable and C is the capacitance of the coaxial cable. Thus, the intrinsic impedance will decrease if the inner conductor diameter is increased while the other dimensions of the coaxial cable remain unchanged. Conventionally, coaxial cable may be 50Ω or 75Ω. Example embodiments described herein are not limited to 50Ω or 75Ω coaxial cable. Indeed, embodiments described herein facilitate selecting a resistance appropriate to a particular implementation, which may be a function of the type of MRI RF coil being implemented. Example embodiments employ coaxial cable that has relatively low loss but that is easy to tune at the working frequency of the particular MRI system in which the MRI RF coil is being implemented. The coaxial cable shield provides inductance and the capacitance between the cable shield and the inner conductor provides the functionality of a capacitor. To provide low loss, the cable shield may be larger (e.g. have more copper) and the inner conductor may be thicker than in a coaxial cable with more loss. However, a larger cable shield and thicker inner conductor reduces flexibility and increases weight. Thus, example embodiments may include a coaxial cable with an inner conductor thickness or a cable shield size based, at least in part, on the flexibility needs of a particular implementation. For example, a first MRI RF coil may be used to image a cervical spinal region, and may therefore privilege flexibility over loss level.

The capacitance of an MRI RF coil comprising a coaxial cable conductor is based, at least in part, on the dielectric material. Recall that there may be a tradeoff between flexibility and loss level. Example embodiments may employ different types of dielectric material, including polytetrafluoroethylene (PTFE) dielectric material, fluorinatedethylenepropylene (FEP) dielectric material, ethylene plus tetrafluoroethylene (ETFE) dielectric material, or perfluoroalkoxy alkanes (PFA) dielectric material.

The loss level and flexibility of a coaxial cable also depends on the outer conductor. The outer conductor, or shield, may be a single layer shield, or a multiple layer shield. For example, the outer conductor may be a single layer braided copper shield, or a single layer foil shield. One approach to lower the loss of the coaxial cable is to use a multiple layer shield. A multiple layer shield may include foil layer and a braided copper layer. The braided copper layer conducts the current and contributes to a lower loss level. However, a double layer shield may be heavier or less flexible than a single layer shield. Thus, example embodiments may employ a single layer foil shield, a single layer braided copper shield, or a multiple layer shield that includes a foil shield layer and a braided copper layer, where the particular shield used is selected as a function of the required loss level or level of flexibility. Other types of shield, or numbers of layers of shields may be employed by other embodiments.

Figure 8:
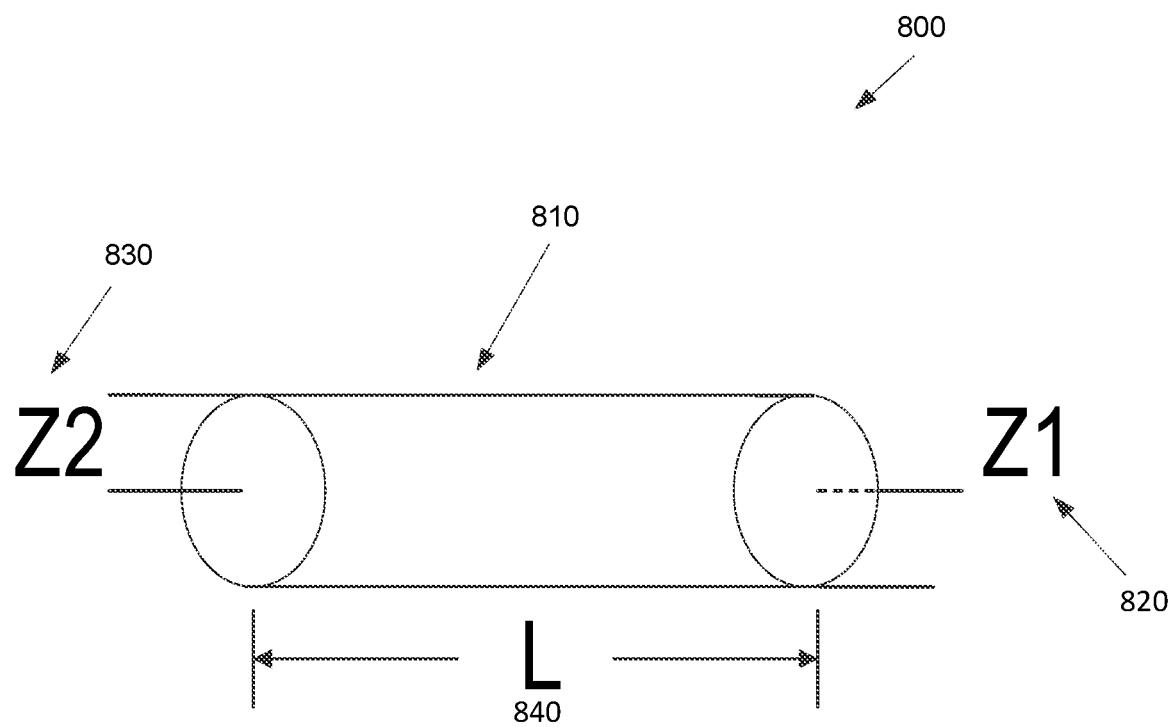
FIG. 8 illustrates a section of a coaxial cable MRI RF coil.

FIG. 8 illustrates portions of an example MRI RF coil 800. MRI RF coil 800 includes a coaxial transmission line 810 having a length L 840 that equals an odd number of quarter wavelengths of an RF signal. MRI RF coil 800 may also include a first coil and a second coil (not illustrated for clarity of illustration). Coaxial transmission line 810 may function as a transformer. Recall that a coaxial cable includes an inner conductor and an outer conductor or shield. In coaxial cable, energy propagates in an axial direction in the region between the two conductors. The impedance $Z_2$ 830 associated with the first coil can be computed according to:

$$Z_2 = \frac{Z_0^2}{Z_1}$$

where $Z_1$ 820 represents the impedance associated with the second coil, and $Z_0$ represents an intrinsic or characteristic impedance of the transmission line 810.

$Z_1$ and $Z_2$ can be complex. Furthermore, according to Ohm's law, $$i = \frac{V}{Z}.$$

Thus, a current $i_1$ in the first coil can be written as $$i_1 = \left|\frac{V_1}{Z_1}\right|,$$

where $V_1$ is the voltage across $Z_1$. If we define V2 as the voltage across $Z_2$, then $$i_2 = \left|\frac{V_2}{Z_2}\right|.$$

Figure 9:
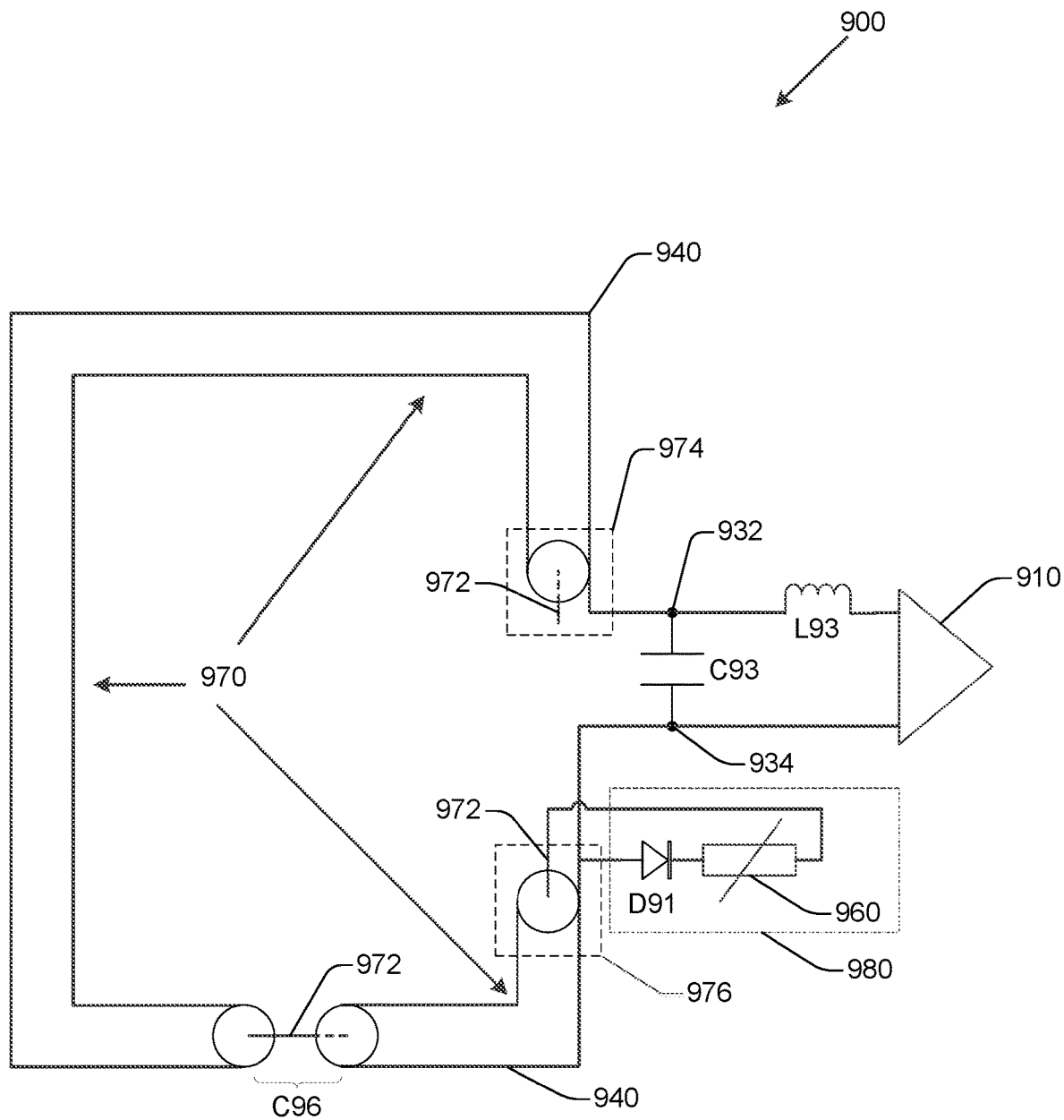
FIG. 9 illustrates an example coaxial cable MRI RF coil with integrated decoupling.

FIG. 9 illustrates an example MRI RF coil 900. MRI RF coil 900 has a capacitance. MRI RF coil 900 is configured to operate in a transmit (Tx) or receive (Rx) mode. MRI RF coil 900 includes an LC circuit and a decoupling circuit 980.

The LC circuit includes at least one coaxial cable 970. The at least one coaxial cable 970 has a first end 974 and a second end 976. The at least one coaxial cable 970 includes an inner conductor 972, an outer conductor 940, and a dielectric spacer (not illustrated) disposed between the inner conductor 972 and the outer conductor 940. The dielectric spacer may include a polytetrafluoroethylene (PTFE) dielectric material, a fluorinatedethylenepropylene (FEP) dielectric material, an ethylene plus tetrafluoroethylene (ETFE) dielectric material, or a perfluoroalkoxy alkanes (PFA) dielectric material. In another embodiment, other types of dielectric material may be employed. In one embodiment, the inner conductor 972 of a first member of the at least one coaxial cable 970 is continuous between the first end and the second end. In this embodiment, the outer conductor 940 of the first member is not continuous at a first point C96 between the first end 974 and the second end 976.

The LC circuit also includes a matching capacitor C93. Matching capacitor C93 has a first terminal 932 and a second terminal 934. Matching capacitor C93 is connected at the first terminal 932 to the outer conductor 940 of the first member of the at least one coaxial cables 970 at the first end 974. Matching capacitor C93 is connected at the second terminal 934 to the outer conductor 940 of the at least one coaxial cable 970 at the second end 976.

The LC circuit also includes a pre-amplifier 910 having a first input terminal connected to an inductor L93. Pre-amplifier 910 has a second input terminal connected to the second terminal 934 of the matching capacitor C93. The inductor L93 is connected between the first input terminal of pre-amplifier 910 and the first terminal 932 of the matching capacitor C93. Pre-amplifier 910 may be a low noise amplifier (LNA).

MRI RF coil 900 includes a decoupling circuit 980. Decoupling circuit 980 includes a PIN diode D91. PIN diode D91 has a first terminal and a second terminal. The first terminal of PIN diode D91 is connected to the outer conductor 940 of the first member 970 at the second end 976. In one embodiment, the first terminal of the PIN diode D91 is an anode, and the second terminal of the PIN diode D91 is a cathode. In another embodiment, the first terminal of the PIN diode D91 is a cathode, and the second terminal of the PIN diode D91 is an anode.

Decoupling circuit 980 also include a tunable device 960. Tunable device 960 is connected between the second terminal of the PIN diode D91 and the inner conductor 972 of the first member 970 at the second end 976. The tunable device 960 controls an impedance at the first point C96. Recall that an induced current may be generated in an MRI RF coil. In one embodiment, a magnitude of a current induced in MRI RF coil 900 while MRI RF coil 900 operates in a Tx mode is a function of an impedance at the first point C96. Embodiments described herein thus facilitate controlling a magnitude of an induced current in an MRI RF coil.

In one embodiment, the PIN diode D91 is driven to a first state when the MRI RF coil 900 is transmitting RF energy. The first state blocks current from flowing through the LC circuit. In this embodiment, PIN diode D91 is driven to a second, different state when the MRI RF coil 900 is not transmitting RF energy. The second state allows current to flow through the LC circuit. In one embodiment, MRI RF coil 900 may include a PIN diode control circuit that is connected to PIN diode D51. The PIN diode control circuit may be configured to control the application of DC bias to drive PIN diode D91 to the first state or the second state. The PIN diode control circuit may be connected to, for example, an MRI system, or an MRI system control computer.

In one embodiment, the at least one coaxial cable 970 is a flexible coaxial cable. The at least one coaxial cable 970 has a diameter. In one embodiment, the diameter of the at least one coaxial cable 700 may be 0.2 mm. In another embodiment, the diameter of the at least one coaxial cable may be 3 mm. In another embodiment, the diameter of at least one coaxial cable 970 may be between 0.2 mm and 3.0 mm. In another embodiment, the at least one coaxial cable 970 may have another, different, diameter.

In one embodiment, outer conductor 940 is a single-layer outer conductor. The single layer outer conductor may be a braided copper shield or a foil shield. In another embodiment, other types of single layer outer conductor may be employed.

In one embodiment, outer conductor 940 is a multi-layer outer conductor. The multi-layer outer conductor may include a braided copper shield and a foil shield. In another embodiment, the multi-layer outer conductor may include other, different types of shield.

By employing flexible coaxial cable MRI RF coil 900 may be configured as a flexible RF coil. A flexible RF coil may be positioned closer to a region being imaged than a rigid, non-flexible coil. For example, a flexible RF coil may be placed closer to a knee being imaged in an MRI system, or closer to a region of cervical spine being imaged in an MRI system, than a rigid coil. Placing the flexible RF coil closer to the region being imaged may facilitate an improved signal to noise ratio for the resulting image compared to conventional approaches.

The diameter of a coaxial cable affects the flexibility or weight of the coaxial cable. Thus, the flexibility of at least one coaxial cable 970 may be adjustable by using different diameters of coaxial cable, different types of dielectric material, or different configurations of shield. For example, a first embodiment of coil 900 in which at least one coaxial cable 970 has a first diameter may have a different level of flexibility than a second embodiment of coil 900 in which at least one coaxial cable 970 has a second, different diameter. In another embodiment, at least one coaxial cable 970 may include different diameters of coaxial cable, different types of dielectric material, or different configurations of shield. Example embodiments may thus have different levels of flexibility at different locations. For example, in one embodiment, MRI RF coil 900 may have a first level of flexibility at the first end 974, and a second, different level of flexibility at the second end 976.

Embodiments described herein facilitate controlling the capacitance of an MRI RF coil. In one embodiment, the capacitance of MRI RF coil 900 is controlled by the size of a location at which the outer conductor 940 is disrupted between the first end 974 and the second end 976. In another embodiment, the capacitance of MRI RF coil 900 is controlled by the shape of a location at which the outer conductor 940 is disrupted between the first end 974 and the second end 976.

In one embodiment, MRI RF coil 900 further comprises a coaxial transmission line. The coaxial transmission line may connect MRI RF coil 900 with a second, different MRI RF coil, or with an MRI apparatus. For example, the coaxial transmission line may connect MRI RF coil 900 with another MRI RF coil as part of a phased array. The coaxial transmission line may be a flexible coaxial cable. The coaxial transmission line may be connected to an output terminal of preamplifier 910.

Circuits, apparatus, MRI RF coils, and other embodiments described herein are described with reference to the drawings in which like reference numerals are used to refer to like elements throughout, and where the illustrated structures are not necessarily drawn to scale. Embodiments are to cover all modifications, equivalents, and alternatives falling within the scope of the invention. In the figures, the thicknesses of lines, layers and/or regions may be exaggerated for clarity. Nothing in this detailed description (or drawings included herewith) is admitted as prior art.

Like numbers refer to like or similar elements throughout the description of the figures. When an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (e.g., "between" versus "directly between," "adjacent" versus "directly adjacent," etc.).

Figure 10:
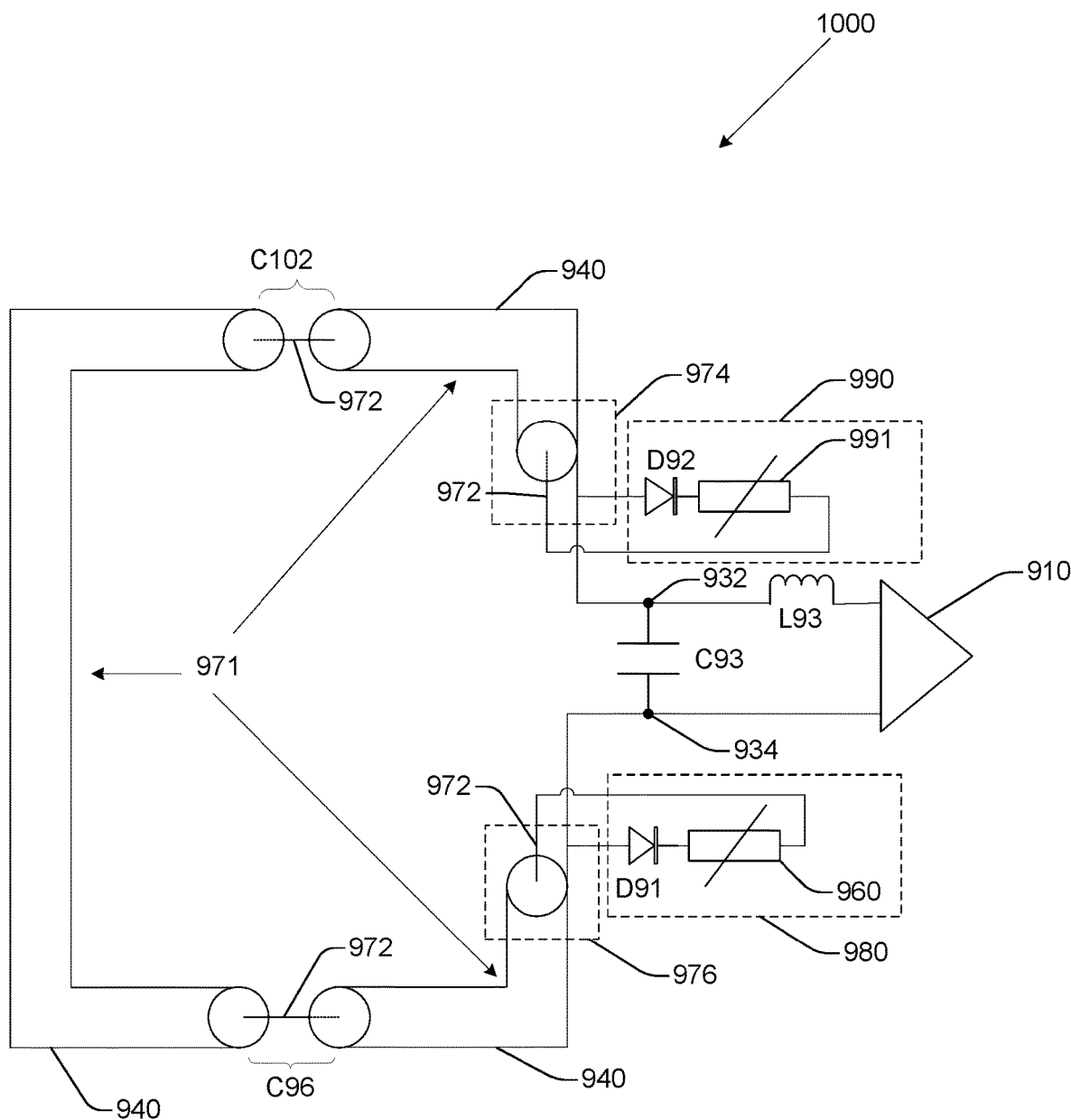
FIG. 10 illustrates an example coaxial cable MRI RF coil with integrated decoupling.

FIG. 10 illustrates an example MRI RF coil 1000 configured to operate in a Tx mode or an Rx mode. MRI RF coil 1000 is similar to MRI RF coil 900 but includes additional details and elements. MRI RF coil 1000 includes an LC circuit that includes at least one coaxial cable 971 having a first end 974 and a second end 976.

In one embodiment, a member of the at least one coaxial cables 971 includes an inner conductor 972, an outer conductor 940, and a dielectric spacer (not illustrated) disposed between the inner conductor 972 and the outer conductor 940. The inner conductor 972 of the first member of the at least one coaxial cables 971 is continuous between the first end 974 and the second end 976. In this embodiment, the outer conductor 940 of the first member 971 is not continuous at a first point C96 and at a second point C102 between the first end 974 and the second end 976.

The at least one coaxial cable 971 may be a flexible coaxial cable. In one embodiment, the diameter of the at least one coaxial cable 971 is 0.2 mm. In another embodiment, the diameter of the at least one coaxial cable 971 is 3 mm. In another embodiment, the diameter of the at least one coaxial cable 971 may range from 0.2 mm to 3 mm.

In one embodiment, outer conductor 940 is a single-layer outer conductor. The single layer outer conductor may include a braided copper shield or a foil shield. In another embodiment, outer conductor 940 is a multi-layer outer conductor. The multi-layer outer conductor may include a braided copper shield and a foil shield. In another embodiment, the multi-layer outer conductor may include other, different shield types. In one embodiment, the dielectric spacer is a PTFE dielectric material, an FEP dielectric material, an ETFE dielectric material, or a PFA dielectric material. Other types of dielectric material may be employed.

MRI RF coil 1000 also includes a matching capacitor C93 having a first terminal 932 and a second terminal 934. Matching capacitor C93 is connected at the first terminal 932 to the outer conductor 940 of the first member 971 at the first end 974, and connected at the second terminal 934 to the outer conductor 940 of the first member 971 at the second end 976.

MRI RF coil 1000 also includes a pre-amplifier 910 having a first input terminal connected to an inductor L93. Pre-amplifier 910 has a second input terminal connected to the second terminal 934 of the matching capacitor C93. The inductor L93 is connected between the first input terminal of pre-amplifier 910 and the first terminal 932 of the matching capacitor C93.

MRI RF coil 1000 includes a first decoupling circuit 980. First decoupling circuit 980 includes a first PIN diode D91 having a first terminal and a second terminal. The first terminal of first PIN diode D91 is connected to the outer conductor 950 of the first member 971 at the second end 976. First decoupling circuit 980 also includes a first tunable device 960. First tunable device 960 is connected between the second terminal of the first PIN diode D91 and the inner conductor 972 of the first member 971 at the second end 976. First tunable device 960 controls an impedance at first point C96.

MRI RF coil 1000 also includes a second decoupling circuit 990. Second decoupling circuit 990 includes a second PIN diode D92 and a second tunable device 991. Second PIN diode D92 has a first terminal and a second terminal. The first terminal of second PIN diode D92 is connected to the outer conductor 940 of the first member 971 at the first end 974. Second tunable device 991 is connected between the second terminal of the second PIN diode D92 and the inner conductor 972 of the first member 971 at the first end 974. Second tunable device 991 controls an impedance at the second point C102.

In one embodiment, the magnitude of an induced current in the MRI RF coil 1000 while the MRI RF coil 1000 operates in a Tx mode is a function of the impedance at the first point C96 or the impedance at the second point C102. Embodiments described herein facilitate controlling the capacitance of an MRI RF coil, including MRI RF coil 1000. In one embodiment, the capacitance of MRI RF coil 1000 is controlled by the size of a first location C96 or a second location C102 at which the outer conductor 940 is disrupted between the first end 974 and the second end 976. In another embodiment, the capacitance of MRI RF coil 1000 is controlled by the shape of a first location C96 or a second location C102 at which the outer conductor 940 is disrupted between the first end 974 and the second end 976. In another embodiment, the outer conductor 940 may be disrupted at additional, different locations, and MRI RF coil 1000 may include additional decoupling circuits.

Figure 11:
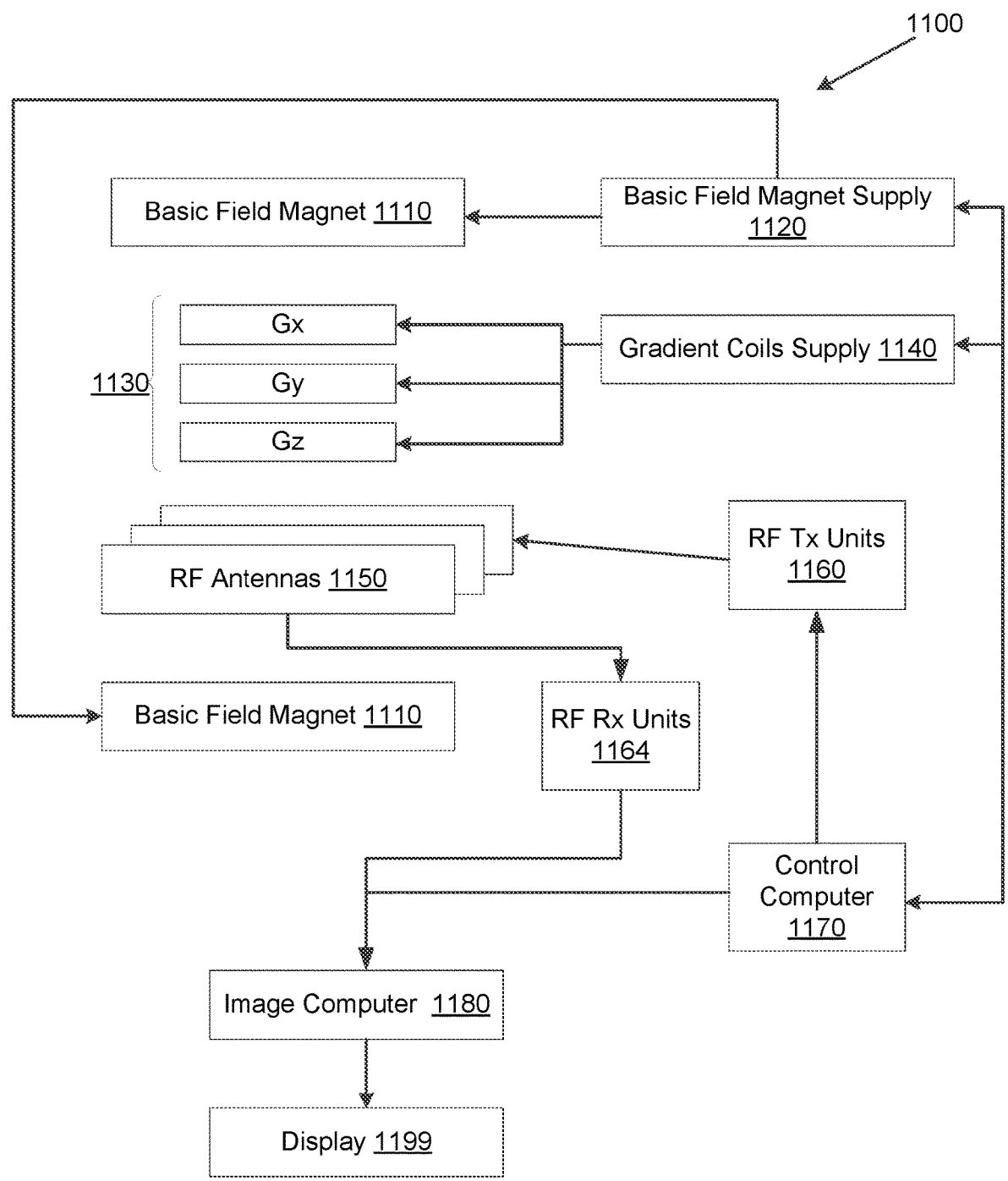
FIG. 11 illustrates an example MRI apparatus.

FIG. 11 illustrates an example MRI apparatus 1100 configured with a set of example MRI RF coils having integrated decoupling circuits. The apparatus 1100 includes a basic field magnet(s) 1110 and a basic field magnet supply 1120. Ideally, the basic field magnets 1110 would produce a uniform B0 field. However, in practice, the B0 field may not be uniform, and may vary over an object being imaged by the MRI apparatus 1100. MRI apparatus 1100 may include gradient coils 1130 configured to emit gradient magnetic fields like $G_S$, $G_P$ and $G_R$. The gradient coils 1130 may be controlled, at least in part, by a gradient coils supply 1140. In some examples, the timing, strength, and orientation of the gradient magnetic fields may be controlled and thus selectively adapted during an MRI procedure.

MRI apparatus 1100 may include a set of RF antennas 1150 having integrated decoupling circuits. The set of RF antennas 1150 are configured to generate RF pulses and to receive resulting magnetic resonance signals from an object to which the RF pulses are directed. The RF antennas 1150 may be controlled, at least in part, by a set of RF transmission units 1160. An RF transmission unit 1160 may provide a signal to a member of the set of RF antennas 1150. The signal may include a control signal. RF transmission unit 1160 may also provide a current or a voltage to a member of the set of RF antennas 1150. In one embodiment, members of the set of RF antennas 1150 may employ an integrated decoupling circuit that includes a PIN diode and a tunable element like the RF coils described herein. The set of RF antennas 1150 may include embodiments described herein, including MRI RF coils 900, 1000, or 1200.

The gradient coils supply 1140 and the RF transmission units 1160 may be controlled, at least in part, by a control computer 1170. The magnetic resonance signals received from the RF antennas 1150 can be employed to generate an image, and thus may be subject to a transformation process like a two dimensional FFT that generates pixilated image data. The transformation can be performed by an image computer 1180 or other similar processing device. The image data may then be shown on a display 1199. While FIG. 11 illustrates an example MRI apparatus 1100 that includes various components connected in various ways, it is to be appreciated that other MRI apparatus may include other components connected in other ways. In one example, MRI apparatus 1100 may include control computer 1170. In one example, a member of the set of RF antennas 1150 may be individually controllable by the control computer 1170.

Figure 12:
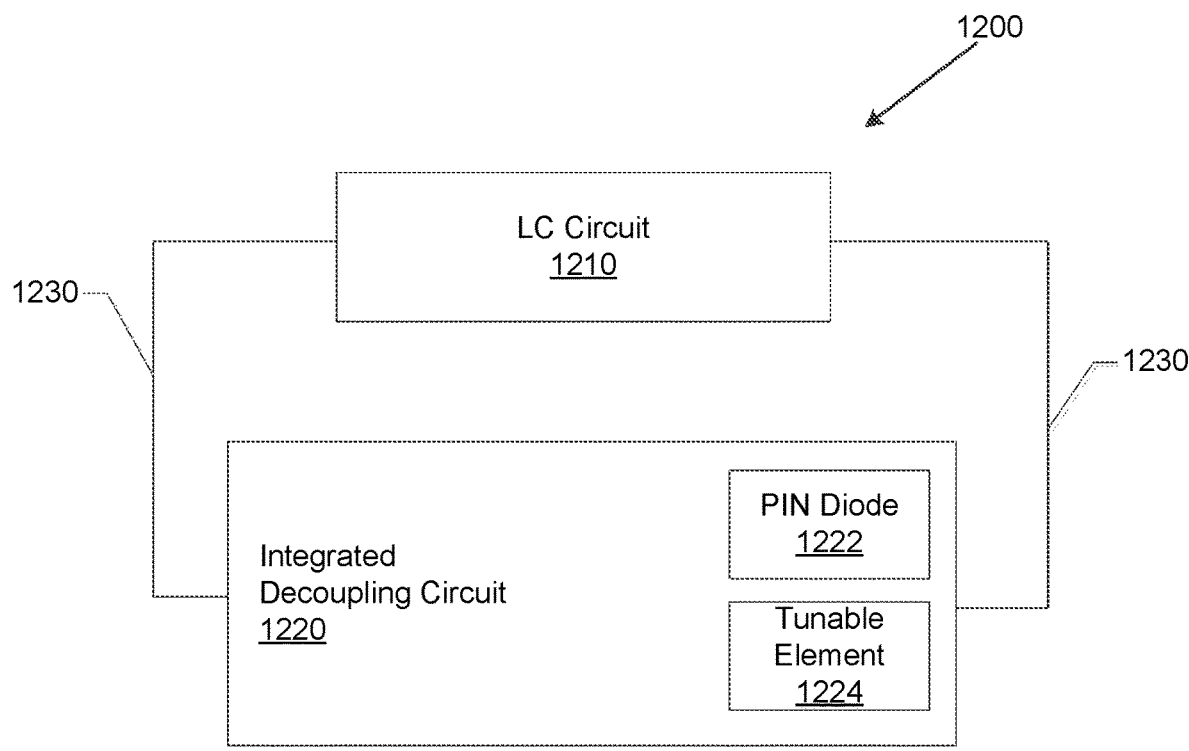
FIG. 12 illustrates an example coaxial cable MRI RF coil with an integrated decoupling circuit.

FIG. 12 illustrates an example MRI coil 1200. MRI coil 1200 includes an LC circuit 1210. LC circuit 1210 includes one or more coaxial cables. The one or more coaxial cables have a first end and a second end, an inner conductor having a first end and a second end, an outer conductor having a first end and a second end, and a dielectric spacer having a first end and a second end. In one embodiment, the outer conductor is not continuous at a first point between the first end and the second end.

MRI coil 1200 performs integrated decoupling using an integrated decoupling circuit (IDC) 1220. IDC 1220 includes a PIN diode 1222 and a tunable element 1224. The IDC 1220 includes a wire or other conductor 1230 that attaches to the LC circuit 1210 at two points. In one embodiment, the PIN diode 1222 and tunable element 1224 are connected in series in the IDC 1220.

In one embodiment, wire or other conductor 1230 is a flexible coaxial cable. Conductor 1230 may have a diameter ranging from 0.2 mm to 3 mm. In one embodiment, conductor 1230 has a diameter of 0.2 mm. In another embodiment, conductor 1230 has a diameter of 3 mm. Other diameters of flexible coaxial cable may be employed.

MRI coil 1200 may be, for example, a receive/transmit (Rx/Tx) coil. Thus, the PIN diode 1222 may be driven to different states to selectively block current from flowing through the LC circuit 1210. For example, during RF transmission the PIN diode 1222 may be driven to a state that isolates the IDC 1220 from the LC coil 1210 to block current from flowing through the LC coil 1210. More generally, the PIN diode 1222 may be driven to a first state when the RF coil 1200 is transmitting RF energy, where the first state blocks current from flowing through the LC circuit 1210. Additionally, the PIN diode 1222 may be driven to a second different state when the MRI coil 1200 is not transmitting RF energy, where the second state allows current to flow through the LC coil 1210.

MRI coil 1200 may be one of a plurality of Rx/Tx coils in an MRI apparatus. Thus, the IDC 1220 selectively decouples the MRI RF coil 1200 from one or more other MRI RF coils associated with the MRI apparatus. To maintain the decoupling function, elements of the LC circuit 1210 and elements of the IDC 1220 produce a reactance through the conductor of the IDC 1220. The reactance is sufficient to prevent self-cancelling between elements of the LC circuit 1210 and elements of the IDC 1220. To maintain decoupling, IDC 1220 may generate an impedance that is high enough so that no large current can flow through 1210 and 1220.

In one embodiment, the tunable element 1224 controls, at least in part, a frequency at which the RF coil 1200 transmits RF energy. In one embodiment, the tunable element 1224 may be tunable with respect to a resistance that controls, at least in part, the frequency at which the LC circuit 1210 resonates during RF transmission. In another embodiment, the tunable element 1224 may be tunable with respect to a capacitance that controls, at least in part, the frequency at which the LC circuit 1210 resonates during RF transmission. In another embodiment, the tunable element 1224 may be tunable with respect to an inductance that controls, at least in part, the frequency at which the LC circuit 1210 resonates during RF transmission. In another embodiment, tunable element 1224 may be tunable with respect to an impedance at the first point.

Recall that conventional coils may have experienced heating issues at a single point of high impedance. In one embodiment, integrated decoupling circuit 1220 includes a second PIN diode and a second tunable element, and the outer conductor is not continuous at at least a first point or location between the first end and the second end, and at a second point or location between the first end and the second end. The second tunable element is configured to control an impedance at the second point. The capacitance of MRI RF coil 1200 may also be controlled by the shape or the size of the first point or location or by the shape or size of the second point or location at which the outer conductor is not continuous. Therefore, elements of the LC circuit 1210 and elements of the integrated decoupling circuit 1220 produce two or more points of high impedance in the RF coil 1200. In one embodiment, the high impedance is at least 1kΩ. Other impedances (e.g., 4kΩ) may be employed.

The following includes definitions of selected terms employed herein. The definitions include various examples or forms of components that fall within the scope of a term and that may be used for implementation. The examples are not intended to be limiting. Both singular and plural forms of terms may be within the definitions.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

In the above description some components may be displayed in multiple figures carrying the same reference signs, but may not be described multiple times in detail. A detailed description of a component may then apply to that component for all its occurrences.

The detailed descriptions presented herein may be presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, calculating, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

To the extent that the term "includes" or "including" is employed in the detailed description or the claims, it is intended to be inclusive in a manner similar to the term "comprising" as that term is interpreted when employed as a transitional word in a claim.

Throughout this specification and the claims that follow, unless the context requires otherwise, the words 'comprise' and 'include' and variations such as 'comprising' and 'including' will be understood to be terms of inclusion and not exclusion. For example, when such terms are used to refer to a stated integer or group of integers, such terms do not imply the exclusion of any other integer or group of integers.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

While example circuits, apparatus, systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

What is claimed is:

1. A magnetic resonance imaging (MRI) radio frequency (RF) coil, where the MRI RF coil has a capacitance, where the MRI RF coil is configured to operate in a transmit (Tx) mode or in a receive (Rx) mode, the MRI RF coil comprising:
   an LC circuit that includes:
      at least one coaxial cable having a first end and a second end, where a member of the at least one coaxial cable includes an inner conductor, an outer conductor, and a dielectric spacer disposed between the inner conductor and the outer conductor, where the inner conductor of a first member of the at least one coaxial cable is continuous between the first end and the second end, and
where the outer conductor of the first member is not continuous at a first point between the first end and the second end;
a matching capacitor having a first terminal and a second terminal, the matching capacitor connected at the first terminal to the outer conductor of the first member at the first end, and connected at the second terminal to the outer conductor of the first member at the second end;
a pre-amplifier having a first input terminal connected to an inductor, and having a second input terminal connected to the second terminal of the matching capacitor, where the inductor is connected between the first input terminal and the first terminal of the matching capacitor; and
a decoupling circuit that includes:
a PIN diode, having a first terminal and a second terminal, the first terminal connected to the outer conductor of the first member at the second end; and
a tunable device connected between the second terminal of the PIN diode and the inner conductor of the first member at the second end, where the tunable device controls an impedance at the first point.

2. The MRI RF coil of claim 1, where a magnitude of a current induced in the MRI RF coil while the MRI RF coil operates in a Tx mode is a function of the impedance at the first point.

3. The MRI RF coil of claim 2, where the at least one coaxial cable is a flexible coaxial cable.

4. The MRI RF coil of claim 3, where a diameter of the at least one coaxial cable is between 0.2 mm and 3 mm.

5. The MRI RF coil of claim 3, where a diameter of the at least one coaxial cable is 0.2 mm.

6. The MRI RF coil of claim 3, where a diameter of the at least one coaxial cable is 3 mm.

7. The MRI RF coil of claim 3, where the outer conductor is a single-layer outer conductor, and where the single layer outer conductor is a braided copper shield or a foil shield.

8. The MRI RF coil of claim 3, where the outer conductor is a multi-layer outer conductor, and where the multi-layer outer conductor includes a braided copper shield and a foil shield.

9. The MRI RF coil of claim 3, where the dielectric spacer is a polytetrafluoroethylene (PTFE) dielectric material, fluorinatedethylenepropylene (FEP) dielectric material, ethylene plus tetrafluoroethylene (ETFE) dielectric material, or a perfluoroalkoxy alkanes (PFA) dielectric material.

10. The MRI RF coil of claim 1, where the capacitance of the MRI RF coil is controlled by the length of a location at which the outer conductor is disrupted between the first end and the second end.

11. The MRI RF coil of claim 1, where the capacitance of the MRI RF coil is controlled by the diameter of the inner conductor and the distance between the inner conductor and an inner edge of the outer conductor at a location at which the outer conductor is disrupted between the first end and the second end.

12. The MRI RF coil of claim 1, where the first terminal of the PIN diode is an anode, and where the second terminal of the PIN diode is a cathode.

13. The MRI RF coil of claim 1, where the first terminal of the PIN diode is a cathode, and where the second terminal of the PIN diode is an anode.

14. The MRI RF coil of claim 1, further comprising a coaxial transmission line that electrically connects the MRI RF coil with a second, different MRI RF coil or with an MRI apparatus, where the coaxial transmission line is connected to an output terminal of the pre-amplifier.

15. The MRI RF coil of claim 1, where the PIN diode is driven to a first state when the MRI RF coil is transmitting RF energy, where the first state blocks current from flowing through the LC circuit.

16. The MRI RF coil of claim 15, where the PIN diode is driven to a second different state when the MRI RF coil is not transmitting RF energy, where the second state allows current to flow through the LC circuit.

17. A magnetic resonance imaging (MRI) radio frequency (RF) coil, where the MRI RF coil has a capacitance, where the MRI RF coil is configured to operate in a transmit (Tx) mode or in a receive (Rx) mode, the MRI RF coil comprising:
an LC circuit that includes:
at least one coaxial cable having a first end and a second end, where a member of the at least one coaxial cable includes an inner conductor, an outer conductor, and a dielectric spacer disposed between the inner conductor and the outer conductor,
where the inner conductor of a first member of the at least one coaxial cable is continuous between the first end and the second end, and
where the outer conductor of the first member is not continuous at a first point and at a second point between the first end and the second end;
a matching capacitor having a first terminal and a second terminal, the matching capacitor connected at the first terminal to the outer conductor of the first member at the first end, and connected at the second terminal to the outer conductor of the first member at the second end;
a pre-amplifier having a first input terminal connected to an inductor, and having a second input terminal connected to the second terminal of the matching capacitor, where the inductor is connected between the first input terminal and the first terminal of the matching capacitor;
a first decoupling circuit that includes:
a first PIN diode, having a first terminal and a second terminal, the first terminal connected to the outer conductor of the first member at the second end; and
a first tunable device connected between the second terminal of the PIN diode and the inner conductor of the first member at the second end, where the tunable device controls an impedance at the first point; and
a second decoupling circuit that includes:
a second PIN diode, having a first terminal and a second terminal, the first terminal connected to the outer conductor of the first member at the first end; and
a second tunable device connected between the second terminal of the second PIN diode and the inner conductor of the first member at the first end, where the second tunable device controls an impedance at the second point.

18. The MRI RF coil of claim 17, where the magnitude of an induced current in the MRI RF coil while the MRI RF coil operates in a Tx mode is a function of the impedance at the first point or the impedance at the second point.

19. The MRI RF coil of claim 17, where the at least one coaxial cable is a flexible coaxial cable.

20. The MRI RF coil of claim 19, where a diameter of the at least one coaxial cable is between 0.2 mm and 3 mm.

21. The MRI RF coil of claim 19, where the outer conductor is a single-layer outer conductor, and where the single layer outer conductor is a braided copper shield or a foil shield.

22. The MRI RF coil of claim 19, where the outer conductor is a multi-layer outer conductor, and where the multi-layer outer conductor includes a braided copper shield and a foil shield.

23. The MRI RF coil of claim 19, where the dielectric spacer is a polytetrafluoroethylene (PTFE) dielectric material, fluorinatedethylenepropylene (FEP) dielectric material, ethylene plus tetrafluoroethylene (ETFE) dielectric material, or a perfluoroalkoxy alkanes (PFA) dielectric material.

24. The MRI RF coil of claim 17, where the capacitance of the MRI RF coil is controlled by the length of a location at which the outer conductor is disrupted between the first end and the second end.

25. The MRI RF coil of claim 17, where the capacitance of the MRI RF coil is controlled by the diameter of the inner conductor and the distance between the inner conductor and an inner edge of the outer conductor at a location at which the outer conductor is disrupted between the first end and the second end.

26. An MRI apparatus, comprising:
a controller; and
an RF coil operably connected to the controller;
where the controller provides the RF coil with a current, a voltage, or a control signal, and
where the RF coil comprises:
a first end;
a second end;
a coaxial cable that connects the first end and the second end, the coaxial cable having an inner conductor, an outer conductor, and a dielectric spacer disposed between the inner conductor and the outer conductor, where the outer conductor of the coaxial cable is not continuous between the first end and the second end at a first location; and
a decoupling circuit, where the decoupling circuit comprises:
a first PIN diode, having a first terminal and a second terminal, the first terminal connected to the outer conductor of the coaxial cable at the second end; and
a first tunable device connected between the second terminal of the PIN diode and the inner conductor of the coaxial cable at the second end, where the first tunable device controls an impedance at the first location at which the outer conductor is disrupted between the first end and the second end;
where a capacitance of the RF coil is controlled by the length of the first location or by the diameter of the inner conductor and the distance between the inner conductor and an inner edge of the outer conductor at the first location.

27. A magnetic resonance imaging (MRI) radio frequency (RF) coil comprising:
an LC circuit, and
at least one integrated decoupling circuit connected to the LC circuit,
where the LC circuit includes one or more coaxial cables having a first end and a second end, where the one or more coaxial cables have an inner conductor having a first end and a second end, an outer conductor having a first end and a second end, and a dielectric spacer having a first end and a second end, where the outer conductor of the one or more coaxial cables is not continuous at a first location between the first end and the second end,
where the at least one integrated decoupling circuit includes one or more conductors, one or more capacitors, a PIN diode, and a tunable element, where the tunable element controls, at least in part, an impedance at the first location, and where the PIN diode selectively electrically isolates the at least one integrated decoupling circuit from the LC circuit.

28. The MRI RF coil of claim 27, where the integrated decoupling circuit decouples the MRI RF coil from one or more other MRI RF coils.

29. The MRI RF coil of claim 27, where the MRI RF coil is configured to operate in a transmit (Tx) mode or a receive (Rx) mode.

30. The MRI RF coil of claim 27, where the magnitude of a current induced in the MRI RF coil while the MRI RF coil operates in Tx mode is a function of the impedance at the first point.

* * * * *

UNITED STATES PATENT AND TRADEMARK OFFICE
CERTIFICATE OF CORRECTION

PATENT NO. : 10,739,422 B2
APPLICATION NO. : 15/596118
DATED : August 11, 2020
INVENTOR(S) : Xiaoyu Yang et al.

Page 1 of 1

It is certified that error appears in the above-identified patent and that said Letters Patent is hereby corrected as shown below:

On the Title Page

Under (71) Applicant; please change "Quality ELectrodynamics, LLC" to --Quality Electrodynamics, LLC--

Signed and Sealed this
Twenty-second Day of September, 2020

Andrei Iancu
*Director of the United States Patent and Trademark Office*